US012713675B2

(12) United States Patent
Saggio et al.

(10) Patent No.: US 12,713,675 B2
(45) Date of Patent: Aug. 18, 2026

(54) METHOD OF MANUFACTURING OHMIC CONTACTS OF AN ELECTRONIC DEVICE, WITH THERMAL BUDGET OPTIMIZATION

(71) Applicant: STMICROELECTRONICS S.r.l., Agrate Brianza (IT)

(72) Inventors: Mario Giuseppe Saggio, Aci Bonaccorsi (IT); Cateno Marco Camalleri, Catania (IT); Gabriele Bellocchi, Catania (IT); Simone Rascuna', Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 403 days.

(21) Appl. No.: 18/363,349

(22) Filed: Aug. 1, 2023

(65) Prior Publication Data

US 2024/0079237 A1 Mar. 7, 2024

(30) Foreign Application Priority Data

Aug. 29, 2022 (IT) ........................ 102022000017733

(51) Int. Cl.
*H10D 64/01* (2025.01)
*H10D 12/01* (2025.01)
*H10D 62/832* (2025.01)

(52) U.S. Cl.
CPC ....... *H10D 64/0115* (2026.01); *H10D 12/031* (2025.01); *H10D 62/8325* (2025.01); *H10D 64/01* (2025.01)

(58) Field of Classification Search
CPC ............... H10D 12/031; H10D 62/393; H10D 62/8325; H10D 64/01; H10D 64/0115; H10D 64/62; H10D 30/0291; H10D 30/66; H10P 30/2042; H10P 30/21
See application file for complete search history.

(56) References Cited

U.S. PATENT DOCUMENTS

| | | | | |
|---|---|---|---|---|
| 9,331,157 | B2 * | 5/2016 | Oka | H10D 12/031 |
| 11,316,025 | B2 * | 4/2022 | Fiorenza | H10D 12/031 |
| 2014/0021623 | A1 * | 1/2014 | Tenaglia | H01L 23/53209 257/773 |
| 2015/0295059 | A1 * | 10/2015 | Wada | H10D 64/01366 257/77 |
| 2016/0247907 | A1 * | 8/2016 | Ohashi | H01L 21/3003 |
| 2018/0226474 | A1 * | 8/2018 | Shimizu | H10D 30/0291 |
| 2021/0175369 | A1 * | 6/2021 | Ohse | H10D 64/64 |
| 2021/0288147 | A1 * | 9/2021 | Shimizu | H10D 62/8325 |

* cited by examiner

*Primary Examiner* — Fazli Erdem
(74) *Attorney, Agent, or Firm* — Seed Intellectual Property Law Group LLP

(57) ABSTRACT

Method of manufacturing an electronic device, comprising forming an ohmic contact at an implanted region of a semiconductor body. Forming the ohmic contact provides for performing a high-temperature thermal process for allowing a reaction between a metal material and the material of the semiconductor body, for forming a silicide of the metal material. The step of forming the ohmic contact is performed prior to a step of forming one or more electrical structures which include materials that may be damaged by the high temperature of the thermal process of forming the silicide.

20 Claims, 5 Drawing Sheets

METHOD OF MANUFACTURING OHMIC CONTACTS OF AN ELECTRONIC DEVICE, WITH THERMAL BUDGET OPTIMIZATION

BACKGROUND

Technical Field

The present disclosure relates to a method of manufacturing an electronic device, with particular reference to the manufacturing of ohmic contacts of the electronic device.

Description of the Related Art

As is known, semiconductor materials having a wide bandgap, in particular, having a high value of the bandgap, low on-state resistance ($R_{ON}$), high value of thermal conductivity, high operating frequencies and high saturation velocity of charge carriers, are ideal for producing electronic components, such as diodes or transistors, in particular for electrical applications. A material having said characteristics, and adapted to be used for manufacturing electronic components, is silicon carbide (SiC). In particular, silicon carbide, in its different polytypes (e.g., 3C—SiC, 4H—SiC, 6H—SiC), is preferable to silicon as regards the properties listed above.

The hexagonal SiC polytype (4H—SiC) is by far the most studied polytype and mass production of 4H—SiC wafers are currently commercially available, albeit at a higher cost than typical silicon wafers.

Electronic devices provided with a Silicon Carbide substrate, compared to similar devices provided with a silicon substrate, have further advantages, such as low output resistance in conduction, low leakage current, and high operating frequencies. In particular, SiC Schottky diodes have demonstrated higher switching performances, making SiC electronic devices particularly favorable for high-frequency applications.

Numerous scientific papers have also reported good switching performances of silicon carbide (SiC) MOSFET devices. From an industrial point of view, in addition to switching performances, SiC MOSFET devices also have good structural robustness which is a desirable characteristic in power systems.

A relevant structural element in SiC (in particular 4H—SiC) MOSFET devices is the gate dielectric (or oxide). The properties of the gate dielectric (permittivity, fixed charges, etc.) and the quality of dielectric/SiC interface (interface state density $D_{it}$, near interface oxide traps, NIOTs) have a significant impact on relevant parameters of the MOSFET, such as the field effect channel mobility $\mu_{FE}$, the ON-state resistance and the threshold voltage $V_{th}$. Therefore, the gate dielectric optimization is the prerequisite for fully exploiting the performances of SiC MOSFETs.

Silicon oxide ($SiO_2$) is commonly used in commercial SiC MOSFETs as a gate dielectric, owing to the ease of manufacturing by thermal oxidation of SiC. However, the oxidation rate of SiC is lower than that of Silicon and the interface state density is of about 2-3 orders of magnitude higher than that of the $SiO_2$/Si stack. To reduce the interface state density $D_{it}$ and improve the channel mobility $\mu_{FE}$ of 4H—SiC MOSFETs that use $SiO_2$ as gate dielectric, a post-oxidation annealing (POA) or post-deposition annealing (PDA) step is typically performed in environments rich in nitrogen ($N_2O$, NO). However, thermal oxidation of SiC, as well as POA and PDA processes, typically require high temperatures (>1100° C.) and long annealing times (up to 8 hours in some cases). Furthermore, all these processes lead to the formation of a "disordered" region at the $SiO_2$/SiC interface as a consequence of the inevitable interfacial reoxidation that occurs during high-temperature annealing with NO or $N_2O$. This disordered interface is characterized by the presence of $SiO_x$ and C non-stoichiometric defects, which have a negative effect on both channel mobility and stability of the threshold voltage ($V_{th}$).

According to a solution known to the Applicant, in order to reduce the thermal budget necessary for the SiC oxidation, the $SiO_2$ layers deposited by CVD may be used as gate insulators in $SiO_2$ MOSFETs.

According to a solution known to the Applicant, $Al_2O_3$ films have been proposed as gate insulators to adjust the $V_{th}$ value in the SiC MOSFETs. High-k insulators (known as "high-k" materials) may be used in particular to increase the $V_{th}$ value in on-state in SiC MOSFETs. However, the integration of high-k dielectrics is limited by their susceptibility to crystallization phenomena at the thermal budgets required for forming contacts in SiC devices (>800° C.). Furthermore, the bandgap of the insulators decreases as their permittivity increases; consequently, the choice of a simple high-k generally causes a small band-offset with SiC and, consequently, a high leakage current.

In SiC power MOSFETs, ohmic contacts are formed by silicizing a metal, to form silicides. High-temperature steps are involved in this process which may be harmful in some implementations. For example, dielectrics used as a hydrogen-rich gate dielectric (deposited by PECVD) cannot be used as intermediate insulation for the gate terminal, due to the intrinsic instability of this layer at the temperatures used during the process of forming the silicide. Additionally, implementations with high-k dielectrics suffer from excessively high process temperatures. This limitation is due to the degradation of the dielectric characteristics of the material (in other words, once these materials are deposited on the wafer, the subsequent process steps cannot use temperatures higher than those characteristic of, or withstood by, the high-k material used).

Therefore, there is a need to define a process of manufacturing ohmic contacts which takes into account the problems set forth above, in particular with reference to the need to optimize the thermal budgets as a function of the gate dielectric used.

BRIEF SUMMARY

According to the present disclosure, a method of manufacturing an electronic device is provided, comprising forming, in a semiconductor body of Silicon Carbide, a first implanted region which extends into the semiconductor body facing a first side of the semiconductor body. The method further comprises forming, in contact with the semiconductor body at the first implanted region, a reaction layer of a metal material; forming an ohmic contact at the first implanted region, by performing a thermal process for allowing a reaction between the metal material and the material of the semiconductor body at the first implanted region for forming a silicide of the metal material; and forming one or more further electrical structures of the electronic device, the further electrical structures including one or more materials that may be damaged by the thermal process, wherein the step of forming the ohmic contact is performed prior to the step of forming the one or more further electrical structures of the electronic device.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The present disclosure, as set forth hereinbelow, provides for a step of forming the ohmic contacts prior to forming the gate terminal, optimizing the distribution of the thermal budget within the process flow and allowing the use of materials (in particular for the gate dielectric) which might not be compatible with high process temperatures, in particular with the temperatures used for forming the ohmic contacts of the source and/or body wells.

The present disclosure also provides for the formation of ohmic contacts based on metal silicides (e.g., Ti) formed at high temperatures, covered with high-melting metal layers (e.g., W). These are layers that do not melt at process temperatures. They are covering layers that preserve the morphology of the structures, remaining solid during the formation of the contact.

Figure 1:
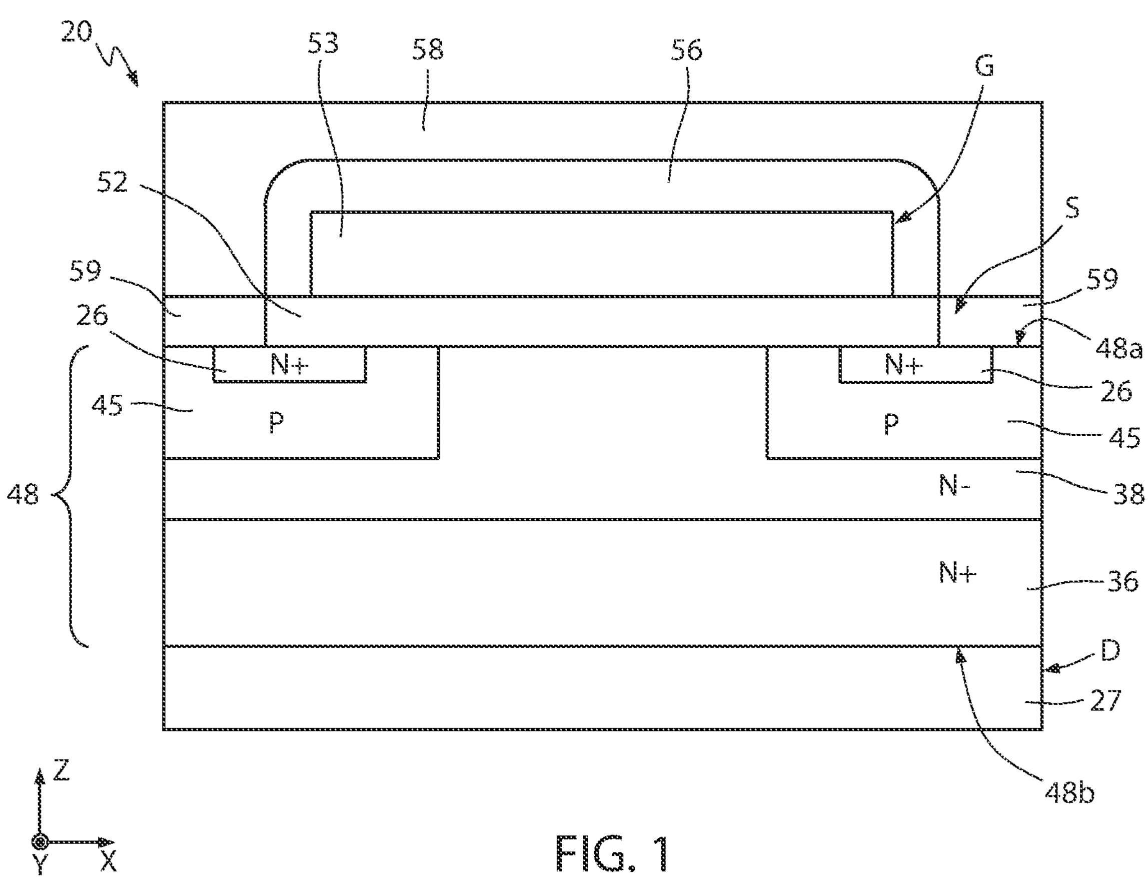
FIG. 1 illustrates, in lateral sectional view, a MOSFET device according to an aspect of the present disclosure.
Figure 1:
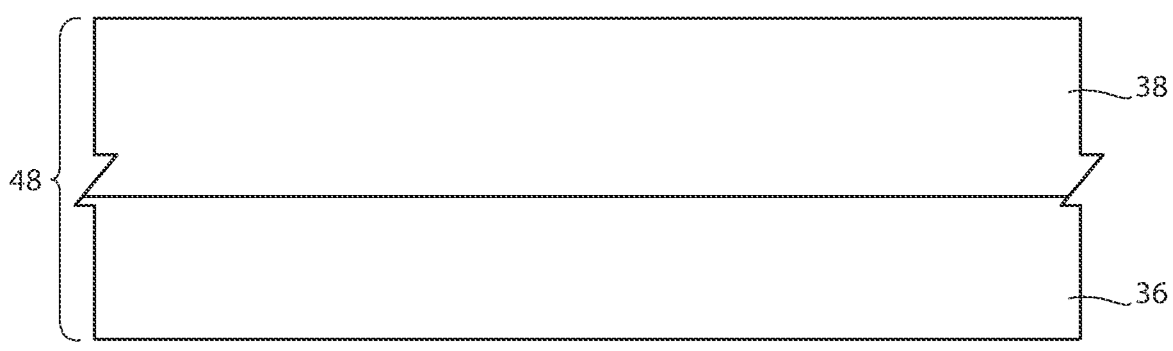

FIG. 1 illustrates, in sectional view in a Cartesian (triaxial) reference system of axes X, Y, Z, a transistor 20, in particular a vertical-channel MOSFET, even more in particular a power MOSFET, according to an aspect of the present disclosure. The transistor 20 comprises: a gate terminal G (forming a control terminal) coupleable, in use, to a generator of a biasing voltage $V_{GS}$; a first conduction terminal S, including a source region 26 (N-type implanted region) and a source metallization 59 (for example of Nickel, which forms an ohmic electrical contact with the source region 26); and a second conduction terminal D or drain region D (including a drain metallization 27, for example of Nickel, which forms an ohmic electrical contact). In use, with suitable biasing, a conductive channel of majority carriers (here, electrons) is established between the source region 26 and the drain region 27.

In greater detail, the transistor 20 comprises a semiconductor body 48, in particular of SiC, having a first and a second face 48*a*, 48*b* opposite to each other along the direction of the Z axis. In particular, in the present embodiment, the term "semiconductor body" means a structural element or solid body that may comprise one or more epitaxial layers grown on a base substrate. In particular, FIG. 1 illustrates a semiconductor body 48 including a base substrate 36 having an epitaxially grown structural layer 38 extending thereon, acting as a drift layer. The substrate 36 has a first conductivity, here of N-type, and doping for example comprised between $1\cdot10^{18}$ cm$^{-3}$ and $5\cdot10^{19}$ cm$^{-3}$. The structural layer 38 has the first conductivity, here of N-type, and lower doping than that of the substrate 36, for example comprised between $1\cdot10^{14}$ cm$^{-3}$ and $5\cdot10^{16}$ cm$^{-3}$.

According to one aspect of the present disclosure, the polytype of the semiconductor body 48 is the cubic polytype of Silicon Carbide, or 3C—SiC. Alternatively, and according to a further aspect of the present disclosure, the polytype of the semiconductor body 48 is 4H—SiC. However, the present disclosure also finds application for further and different silicon carbide polytypes.

The gate terminal G extends on the first face 48*a* of the semiconductor body 48; a body region 45, having a second conductivity opposite to the first conductivity (here, a P-type implanted region), extends into the semiconductor body 48 (more in particular, into the structural layer 38) at (facing) the first face 48*a*; the source region 26, having the first conductivity, extends into the body region 45 at (facing) the first surface 48*a*; and the drain metallization 27 extends at the second face 48*b* of the semiconductor body 48. The transistor 20 is therefore of vertical-conduction type (i.e., the conductive channel extends along a main direction which is along the Z axis).

The gate terminal G includes a gate metallization 53, and a gate dielectric 52. The gate metallization 53 extends on the gate dielectric 52.

The gate dielectric 52 may be of any material suitable for the purpose, such as for example an oxide (e.g., $SiO_2$), or a compound, a multilayer or an alloy including aluminum (e.g., $Al_2O_3$, AlN, AlON). The gate dielectric 52 may also be formed by a plurality of sub-layers forming a stack, or multilayer, including the aforementioned materials, including: $Al_2O_3$, AlN, AlON, AlN/SiN, $Al_2O_3/HfO_2$, $SiO_2/Al_2O_3/SiO_2$, $SiO_2/HfO_2/Al_2O_3$.

Other materials usable to form the gate dielectric 52 include NiO, $CeO_2$, $HfO_2$, SiN, $SiO_2/HfO_2/SiO_2$.

The insulating layer 52 has a thickness, measured along the Z axis, comprised between 10 nm and 100 nm.

An insulating, or dielectric, layer 56 extends on the gate terminal G and is, in particular, of silicon dioxide ($SiO_2$) or silicon nitride (SiN) with a thickness, measured along the Z axis, comprised between 0.5 μm and 1.5 μm. Furthermore, a source terminal 58, in particular of metal material, for example Aluminum, with a thickness, measured along the Z axis, comprised between 0.5 μm and 2 μm, extends in proximity of the insulating layer 56.

The source terminal 58 extends up to contacting the source region 26 through an ohmic contact region 59, of a metal silicide such as for example silicides of Ni, Ti, Co, Pt.

The metal layer 27, for example of Ti/Ni/Au, which forms the gate terminal D, extends on the second face 48*b* of the semiconductor body 48. An interface layer to allow the ohmic contact, not shown, for example of Nickel silicide, may be present between the semiconductor body 48 and the metal layer 27.

With reference to the gate dielectric 52, in one embodiment it is formed by a stack designed in such a way as to have a high density of electron traps, inducing (increasing) the negative charge density within the gate dielectric, during use. In particular, the stack is an insulating multilayer which has at least an energy level that is in energetic proximity (e.g., between 0 eV and 2 eV) of the conduction band of the semiconductor material (e.g., SiC) of the body 48.

In particular, the stack comprises: a first insulating layer, in particular of Silicon Oxide ($SiO_2$), having a thickness, along Z, comprised between 0.5 nm and 5 nm; a second insulating layer on the first insulating layer, in particular of Hafnium Oxide ($HfO_2$), having a thickness, along Z, comprised between 0.5 nm and 5 nm; a third insulating layer on the second insulating layer, in particular of an alloy including aluminum (e.g., $Al_2O_3$, AlN, AlON), having a thickness, along Z, comprised between 10 nm and 100 nm. In one embodiment, the third insulating layer is formed by a plurality of (e.g., two) sub-layers of $Al_2O_3$ and $HfO_2$.

Variants to what has been described above are possible, in particular the first insulating layer may alternatively be of SiN, AlN; the second insulating layer may alternatively be of HfSiOx, ZrO2, ZrSiOx; the third insulating layer may alternatively be of AlSiOx, HfSiOx.

Manufacturing steps of the MOSFET device 20 are now illustrated with reference to FIGS. 2A-2F.

FIGS. 2A-2F illustrate a portion of a device (e.g., a MOSFET of the type illustrated in FIG. 1), limitedly to source and body regions whereat it is desired to form respective ohmic contacts 59, 61. The teaching of FIGS. 2A-2F applies, generally, to the formation of any ohmic contact in the MOSFET device 20 and, more generally, in devices of different type, for example VMOS ("Vertical-channel MOS"), DMOS ("Diffused MOS"), CMOS ("Complementary MOS"), FET, trench-FET.

For simplicity of description and improved clarity, in the context of FIGS. 2A-2F the same reference numbers of FIG. 1 will be used to illustrate common elements, without thereby losing generality.

Figure 2A:
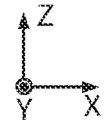
FIGS. 2A-2F illustrate, showing a lateral section of a portion of an electronic device, a manufacturing method according to the present disclosure.

FIG. 2A comprises steps, per se known and therefore not described in detail, of forming the semiconductor body 48, including providing the substrate 36 and forming, on the substrate 36, the epitaxial layer 38 (by epitaxy).

Figure 2B:
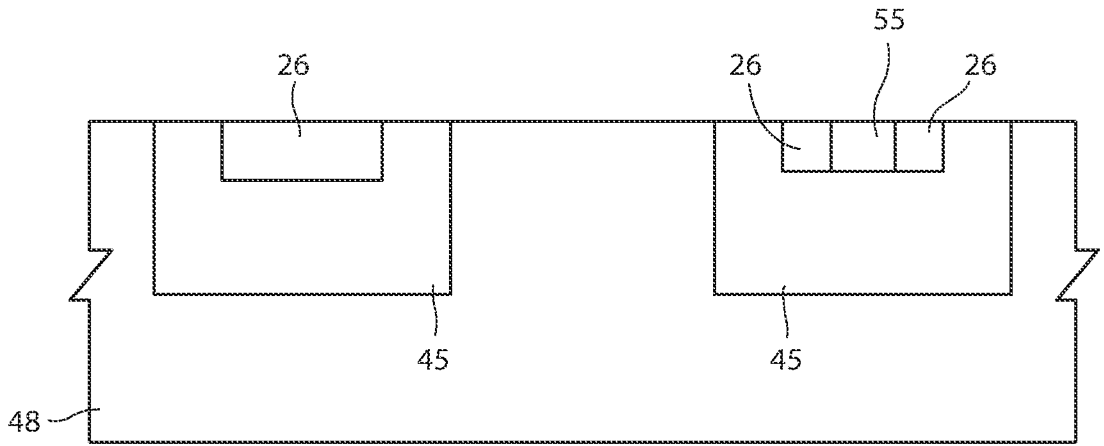
Figure 2B:
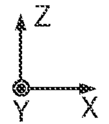

Then, FIG. 2B, implants of doping species are performed for forming the implanted regions 45 (body wells) and 26 (source regions). In this embodiment, a P+ implanted region 55 is also formed within a respective body region 45 and in direct electrical contact with the respective body region 45. Source regions 26 extend laterally to the P+ implanted region 55. The P+ implanted region 55 has the same type of dopants as the body region 45 (here, P-type) and a dopant concentration greater than the dopant concentration of the body region 45. The P+ implanted region 55 has the function of allowing the ohmic contact with the body 45.

An annealing step is then performed (e.g., at a high temperature of about 1400° C.-2000° C.) for the activation of the dopants of the body 45 and source 26 implanted regions.

Figure 2C:
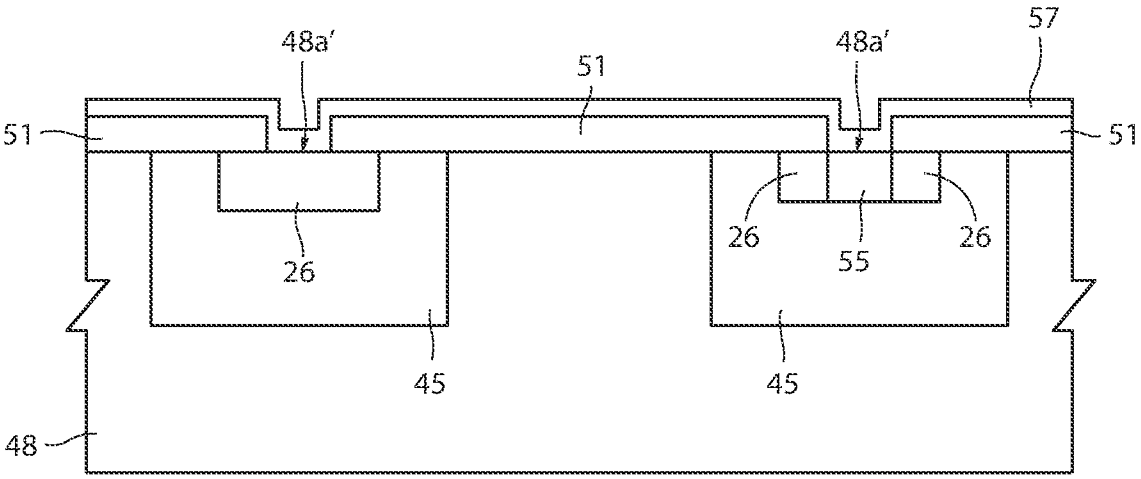
Figure 2C:
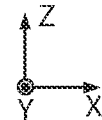

Then, FIG. 2C, the method proceeds with the formation of the source 59 and body 61 ohmic contacts.

This step includes forming a deposition mask 51, for example of Silicon Oxide, patterned in such a way as to leave exposed the surface regions 48*a*' of the semiconductor body 48 whereat it is desired to form the ohmic contacts 59, 61. In the illustrated non-limiting example, the ohmic contacts are formed at the source region 26 (left side of the Figure) and the P+ implanted region 55 (right side of the Figure).

A metal layer 57 (typically Ni, Ti, or a combination of Ni/Ti) is then deposited above the mask 51 and at the surface regions 48*a*' exposed through the mask 51. This step is followed by a suitable high-temperature annealing (rapid thermal process, between 800° C. and 1150° C., more in particular between 900° C. and 1150° C., for a time interval from 1 minute to 120 minutes). This allows the ohmic contacts 59, 61 (e.g., of Nickel Silicide in case the layer 57 is of Ni) to be formed, by chemical reaction between the deposited metal and the Silicon present in the semiconductor body 48 (which, in this embodiment, is of SiC). In fact, the deposited metal reacts where it is in contact with the surface material of the semiconductor body 48, forming the ohmic contact (e.g., of $Ni_2Si$ in case the metal of the layer 57 is Ni).

Figure 2D:
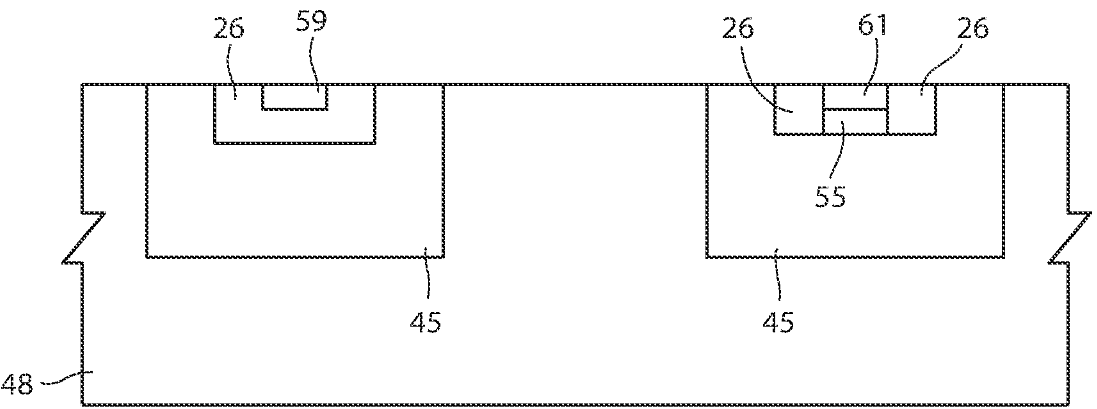
Figure 2D:
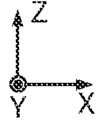

Subsequently, FIG. 2D, the metal of the layer 57 which extends above the mask 51, and also the same mask 51, is removed.

Figure 2E:
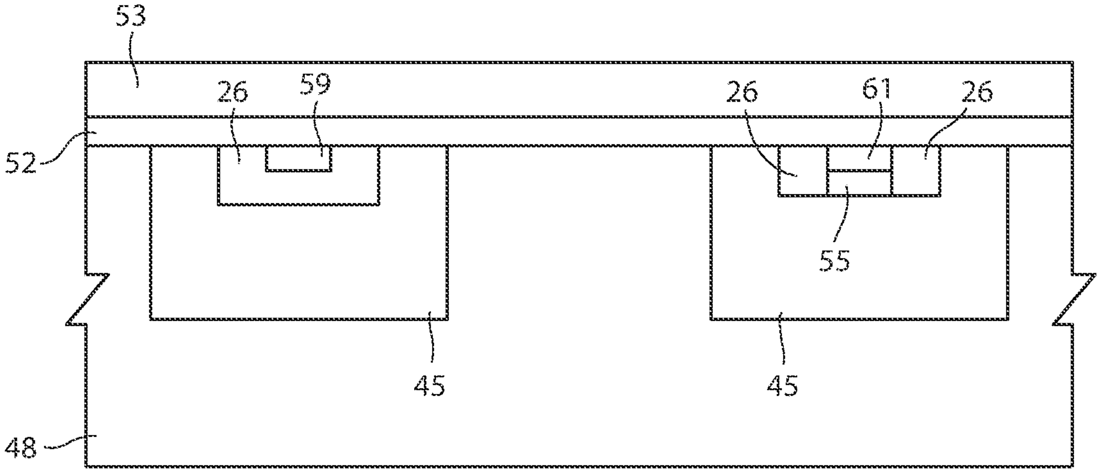
Figure 2E:
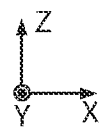

Then, FIG. 2E, one or more steps for forming the gate dielectric 52 are performed.

Forming the gate dielectric 52 may include depositing and photolithographically defining, for example, $SiO_2$ or SiN, or forming a multilayer of the type previously described.

In particular, in a possible embodiment, a multi-layer, or stack, including $SiO_2/HfO_2/Al_2O_3$ is formed on the semiconductor body 48.

Variants to what has been described above are possible, in particular the first insulating layer may alternatively be of $Al_2O_3$, SiN or AlN; the second insulating layer may alternatively be of $HfSiO_x$, $ZrO_2$ or ZrSiOx; a first sub-layer of the third insulating layer may alternatively be of AlSiOx and/or a second sub-layer may alternatively be of $HfSiO_x$.

The first insulating layer has a reduced thickness to allow the tunneling of the electrons from the semiconductor body 48, and has a bandgap greater than the bandgap of the second insulating layer. The first insulating layer therefore has a thickness such that it may be traversed by tunnel effect by the electrons which, confined in the potential well and in a number limited by the states allowed by the well, produce a positive $V_{th}$ of the MOSFET 20.

The layer which acts as a trap for the electrical charges is the second insulating layer, with a reduced bandgap, which forms a quantum-well between the first insulating layer and the third insulating layer. In one embodiment, the hafnium oxide represents a potential well for the electrons confined on one side by the first insulating layer and on the other side by the third insulating layer.

The third insulating layer is configured to have a bandgap greater than the bandgap of the second insulating layer. Since the third insulating layer comprises the two sub-layers previously described (or a plurality thereof), the combined advantages of high bandgap (e.g., the bandgap of $Al_2O_3$ which may be comprised between 7 and 9 eV) and high dielectric constant (e.g., the dielectric constant of $HfO_2$ which is about 20) are achieved.

In one embodiment:

- the first insulating layer has a first bandgap value and a first thickness;
- the second insulating layer has a second bandgap value lower than the first bandgap value and a second thickness greater than the first thickness; and
- the third insulating layer has a third bandgap value comprised between the first and the second bandgap values and a third thickness greater than the second thickness.

In one embodiment:

- the first insulating layer has a thickness comprised between 0.5 nm and 1 nm, extremes included, and a bandgap between 7 and 9 eV, extremes included; the first insulating layer is of $SiO_2$ or of one of the materials indicated above for this layer;
- the second insulating layer has a thickness comprised between 1.5 nm and 2.5 nm, extremes included, and a bandgap between 4 and 6 eV, extremes included; the second insulating layer is of $HfO_2$ or of one of the materials indicated above for this layer; and
- the third insulating layer has a thickness comprised between 10 nm and 100 nm, extremes included, and a bandgap between 7 and 8.5 eV, extremes included; the third insulating layer is a multilayer comprising the first sub-layer and the second sub-layer, or a succession of a plurality of layers alternated to each other.

The stack according to the present disclosure, with respect to a single layer of a high-k material or of a set of sub-layers other than that described herein, allows to combine the advantages of high bandgap of the third insulating layer and the advantages of high dielectric constant of the second insulating layer.

The stack is steady, and has the aforementioned properties, when the materials forming it are amorphous (and non-crystalline). A further additional positive effect is that the proposed structure has a higher capacitance with respect to a gate dielectric of sole Silicon Oxide, allowing to have a higher RC constant, consequently limiting ringing phenomena induced by the fast switching of the MOSFET device 20.

With reference to the process of manufacturing the aforementioned stack, the first Silicon Oxide insulating layer is deposited by thermal oxidation or by bath in oxidizing solution ($H_2O_2$) or by atomic layer deposition (ALD) technique; then, the second insulating layer of $HfO_2$ is formed, by ALD technique on the first insulating layer; then, the third insulating layer of $Al_2O_3$ is formed, also by ALD technique, on the second insulating layer.

In one embodiment, the second insulating layer of $HfO_2$ may be deposited by a thermal process or Plasma, using the parameters according to the following table:

| Method | Oxidizing source(O) | Purging flow | Hf precursor pulsing period | Oxygen pulsing period | Purging period | Deposition temperature |
|---|---|---|---|---|---|---|
| Thermal | $H_2O$ | $N_2$ (1-100 sccm) | 10-200 ms | 10-20 ms | 10-30 s | 200-300° C. |
| Plasma | $O_2$-plasma | $N_2$ (1-100 sccm) | 50-300 ms | 1-5 ms | 10-30 s | 200-300° C. |

In one embodiment, the third insulating layer of $Al_2O_3$ may be deposited by a thermal process or Plasma, using the parameters according to the following table:

| Method | Oxidizing source(O) | Purging flow | Hf precursor pulsing period | Oxygen pulsing period | Purging period | Deposition temperature |
|---|---|---|---|---|---|---|
| Thermal | $H_2O$ | $N_2$ (1-100 sccm) | 10-200 ms | 10-50 ms | 2-5 s | 200-300° C. |
| Plasma | $O_2$-plasma | $N_2$ (1-100 sccm) | 50-300 ms | 0.1-1 s | 2-5 s | 200-300° C. |

As an alternative to deposition by ALD, one or all of the aforementioned insulating layers may be deposited by CVD technique, or reactive ion sputtering.

Then, a post-deposition annealing step is performed, in an environment containing oxygen, or in an inert environment (which has Argon and/or Nitrogen), in particular at a temperature equal to or lower than 1000° C.

Figure 2F:
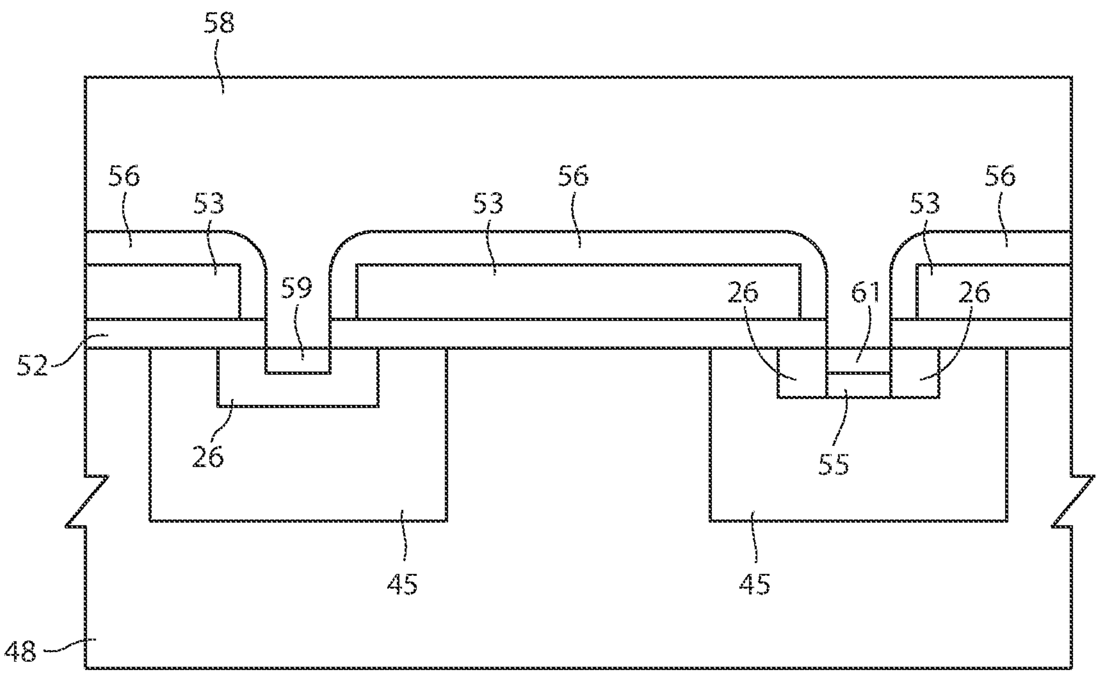
Figure 2F:
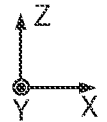

Finally, FIG. 2F, the remaining steps are performed to complete the formation of the MOSFET device, including the formation of the conductive layer 53 of the gate terminal (metallization or polysilicon), in a per se known manner.

In order to electrically contact the source 59 and body 61 ohmic contacts, through openings are formed through the layers 52 and 53, at the source 59 and body 61 ohmic contacts.

The formation of the MOSFET device is then completed by forming the insulating layer 56 and depositing the metallization 58 which electrically contacts the source 59 and body 61 ohmic contacts through the through openings made through the layers 52 and 53.

Figure 3A:
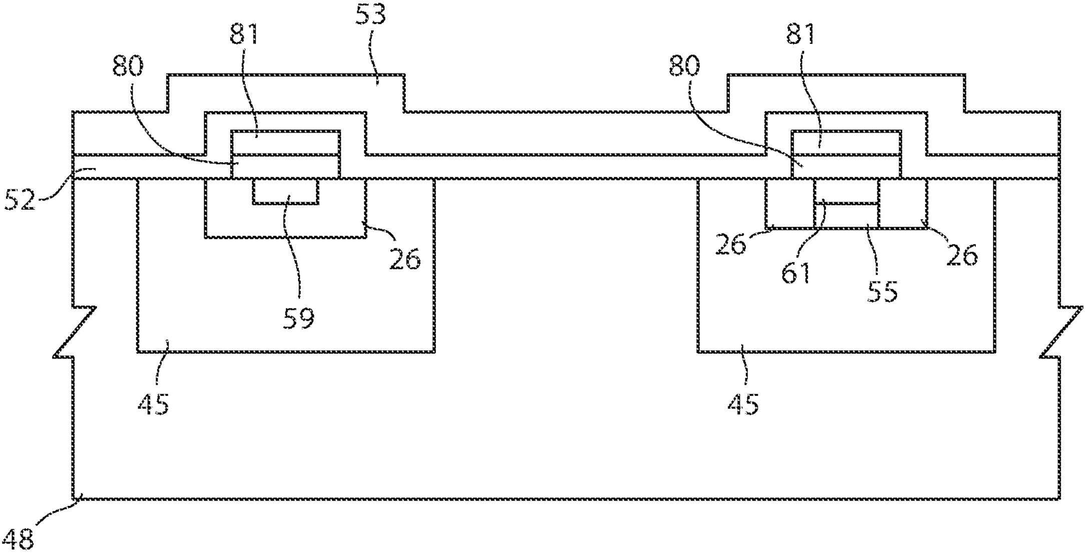
FIGS. 3A-3B illustrate steps of a manufacturing method according to an alternative embodiment of the present disclosure.
Figure 3A:
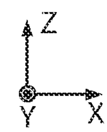

With reference to FIG. 3A, according to an alternative embodiment to that of FIGS. 2E and 2F, after completing the steps already described with reference to FIGS. 2A-2D, a first and a second protection layer 80, 81 are formed at and above the source 59 and body 61 ohmic contacts. The layer 80 is a silicon oxide ($SiO_2$), also known as a "pad oxide", while the layer 81 extending on the layer 80 is Silicon Nitride (SiN, $Si_2N_3$) deposited by LPCVD technique. The protection layers 80, 81 extend on the side 48_a_ limitedly to the surface portions in which ohmic contacts 59, 61 are present, to completely cover them, and do not extend at the regions in which the gate terminal G will be formed. The function of the first and the second protection layers 80, 81 is to "seal" the silicide (covering it) to avoid contaminations towards the outside of the device in successive manufacturing steps.

The method then proceeds with the formation of the gate dielectric 52, in a manner similar to what has been described with reference to FIG. 2E. In this case, the gate dielectric 52 also extends above the first and the second protection layers 80, 81.

Finally, the remaining steps are performed to complete the formation of the MOSFET device, including the formation of the conductive layer 53 of the gate terminal (metallization or polysilicon) and the insulating layer 56.

Figure 3B:
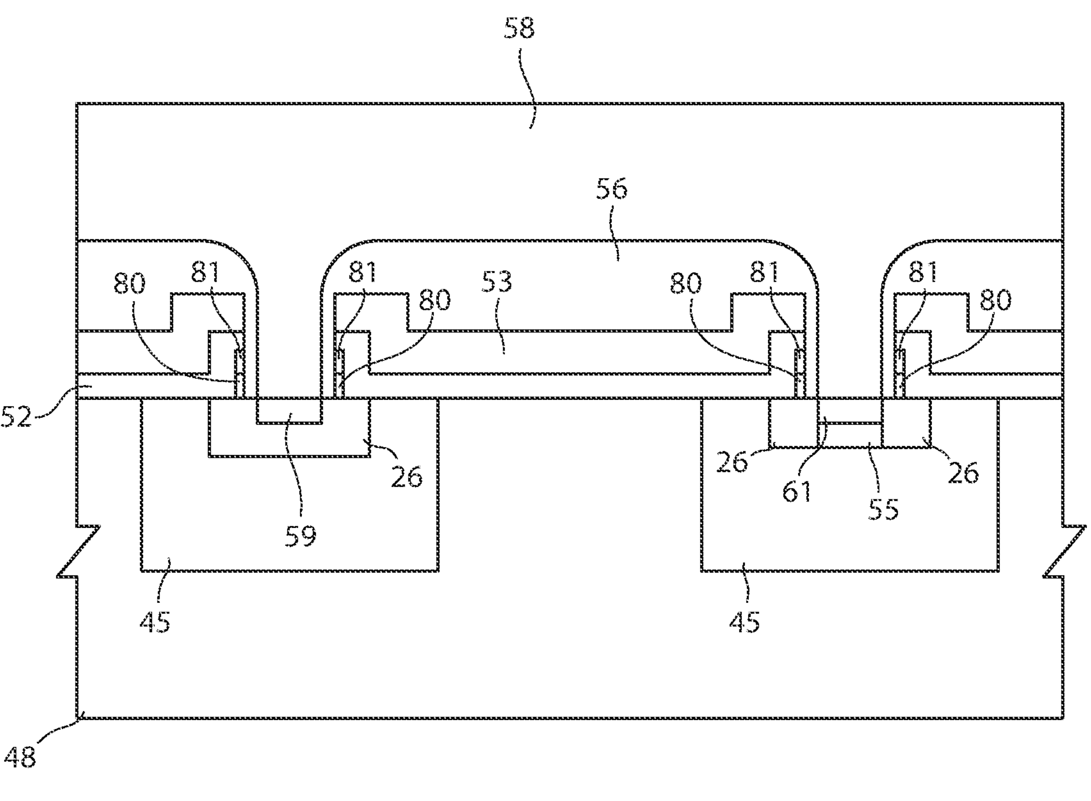

With reference to FIG. 3B, in order to electrically contact the source 59 and body 61 ohmic contacts, through openings are formed through the layers 52, 53, 80 and 81 at the source 59 and body 61 ohmic contacts, exposing them. The formation of the MOSFET device is then completed by forming the insulating layer 56 and depositing the metallization 58 which electrically contacts the source 59 and body 61 ohmic contacts through the through openings made through the layers 52, 53, 80, 81.

From an examination of the characteristics of the disclosure made according to the present disclosure, the advantages that it affords are evident.

In particular, the present disclosure allows the use of materials that suffer from thermal budgets for the formation of silicides (high-K materials, H-rich materials, etc.), since the formation of the silicide ohmic contacts occurs in an initial manufacturing step of the device, prior to forming the gate terminal or other structures.

The proposed solution is implementable both in the case of gate dielectrics which use high-K materials that may be unstable at high temperatures and in the case of traditional gate dielectrics (e.g., of $SiO_2$).

Finally, it is clear that modifications and variations may be made to what has been described and illustrated herein, without thereby departing from the scope of the present disclosure, as defined in the attached claims.

For example, the present disclosure may be limited to the formation of the sole source ohmic contact 59 (in the absence of the ohmic contact 61).

Furthermore, the present disclosure may be limited to forming the sole drain ohmic contact (in the absence of the source 59 and body 61 ohmic contact).

Alternatively, the present disclosure may comprise forming any combination of two or more of: forming the source ohmic contact 59, forming the drain ohmic contact, forming the body ohmic contact 61.

Furthermore, the present disclosure may be applied to devices based on a SiC polytype other than 4H—SiC, for example 3C—SiC or 6H—SiC.

Furthermore, the present disclosure may be applied to devices with substrate (semiconductor body) of a material other than SiC, for example GaN and AlGaN/GaN (e.g., used in HEMTs manufacturing).

The present disclosure is also applicable to horizontal-channel devices.

A method of manufacturing an electronic device (20) may be summarized as including the steps of: forming, in a semiconductor body (48) of Silicon Carbide, a first implanted region (26; 55) which extends into the semiconductor body (48) facing a first side (48*a*; 48*b*) of the semiconductor body (48); forming, in contact with the semiconductor body (48) at the first implanted region (26; 55), a reaction layer (57) of a metal material; forming an ohmic contact (59; 61) at the first implanted region (26; 55), by performing a thermal process for allowing a reaction between said metal material and the material of the semiconductor body (48) at the first implanted region (26; 55) for forming a silicide of said metal material; and forming one or more further electrical structures (G, 53, 56) of the electronic device (20), said further electrical structures including one or more materials that may be damaged by said thermal process, characterized in that the step of forming the ohmic contact is performed prior to the step of forming the one or more further electrical structures (G, 53, 56) of the electronic device (20).

The step of forming said one or more further electrical structures (G, 53, 56) may include forming an electrical control terminal (G) of the electronic device (20).

The electrical control terminal (G) of the electronic device (20) may be a gate terminal and may include a gate dielectric (52) and a gate conductive layer (53) on the gate dielectric (52), the gate dielectric (52) including said material which may be damaged by the thermal process.

The gate dielectric material (52) may be a high-k or hydrogen-rich material.

Said thermal process for forming the ohmic contact may be performed at a temperature including between 800° C. and 1150° C.

The method may further include the step of forming a second implanted region (45) prior to the step of forming the first implanted region (26, 45), said first implanted region (26, 45) being completely contained within the second implanted region (45).

The second implanted region (45) may be a body region of the electronic device (20) and may have a first electrical conductivity (P) and a first concentration of doping species, the first implanted region (26; 55) may be one of: a source region (26) having a second electrical conductivity (N) opposite to the first electrical conductivity (P); and a body contact region (55) having the first electrical conductivity (P) and a second concentration of doping species greater than the first concentration of doping species.

The control terminal (G) may extend laterally to the first implanted region (26; 55).

The method may further include the step of forming a conductive terminal (S; D) in electrical contact with the ohmic contact (59; 61).

Forming the one or more further electrical structures (52, 56) of the electronic device (20) may include depositing one or more dielectric or insulating materials, in particular by ALD technique.

The method may further include the steps of forming, at and above the ohmic contact (59; 61), a multilayer for completely covering the ohmic contact (59; 61), the multilayer including a first protective layer (80) of Silicon Oxide and a second protective layer (81) of Silicon Nitride, said step of forming one or more further electrical structures (52, 53, 56) of the electronic device (20) being performed after forming the first and the second protective layers (80, 81).

The method may further include the step of forming, on the first side (48*b*) of the semiconductor body (48), a mask (51) having a through opening at least one surface portion (48*a*') of the first implanted region (26; 55), the reaction layer (57) being formed above the mask (51) and in contact with the surface portion (48*a*'); the method may further include, prior to the step of forming the ohmic contact, the step of removing the mask (51) and metal material of the unreacted reaction layer (57).

Said electronic device may be a MOSFET.

The semiconductor body (48) may be of Silicon Carbide of the polytype 4H, or 4H—SiC.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing an electronic device, comprising:

forming, in a semiconductor body of Silicon Carbide, a first implanted region which extends into the semiconductor body facing a first side of the semiconductor body;

forming, in contact with the semiconductor body at the first implanted region, a reaction layer of a metal material;

forming an ohmic contact at the first implanted region, by performing a thermal process for allowing a reaction between the metal material and the semiconductor body at the first implanted region for forming a silicide of the metal material;

forming a stack of protection layers on the first side of the semiconductor body, the stack of protection layers being aligned with the first implanted region; and forming one or more electrical structures of the electronic device, the electrical structures including:

a gate dielectric on the semiconductor body and covering the stack of protection layers;

a conductive layer on the gate dielectric;

a metallization having a first portion bisecting the stack of protection layers, the first portion of the metallization being aligned with the ohmic contact; and an insulating layer entirely separating the gate dielectric, the conductive layer, and stack of protection layers from the metallization, wherein the forming the ohmic contact is performed prior to the forming the one or more electrical structures of the electronic device.

2. The method according to claim 1, wherein the forming the one or more electrical structures includes forming an electrical control terminal of the electronic device.

3. The method according to claim 2, wherein the electrical control terminal of the electronic device is a gate terminal and the gate dielectric includes a gate dielectric material which may be damaged by the thermal process.

4. The method according to claim 3, wherein the gate dielectric material is a high-k material.

5. The method according to claim 1, wherein the thermal process for forming the ohmic contact is performed at a temperature in a range of 800° C. and 1150° C.

6. The method according to claim 1, further comprising forming a second implanted region prior to the forming the first implanted region, the first implanted region being completely contained within the second implanted region.

7. The method according to claim 6 wherein the second implanted region is a body region of the electronic device and has a first electrical conductivity and a first concentration of doping species, the first implanted region being one of:

a source region having a second electrical conductivity opposite to the first electrical conductivity; and a body contact region having the first electrical conductivity and a second concentration of doping species greater than the first concentration of doping species.

8. The method according to claim 7 wherein the control terminal extends laterally to the first implanted region.

9. The method according to claim 1, further comprising forming a conductive terminal electrically coupled to the ohmic contact.

10. The method according to claim 1, wherein the forming the one or more electrical structures of the electronic device includes depositing one or more dielectric materials by atomic layer deposition (ALD) technique.

11. The method according to claim 1, wherein the stack of protection layers includes a first protective layer of Silicon Oxide and a second protective layer of Silicon Nitride, the forming the one or more electrical structures of the electronic device being performed after the forming the first and the second protective layers.

12. The method according to claim 1, further comprising forming, on the first side of the semiconductor body, a mask having a through opening at a surface portion of the first implanted region, the reaction layer being formed above the mask and in contact with the surface portion;

the method further including, prior to the forming the ohmic contact, removing the mask and metal material of an unreacted portion of the reaction layer.

13. The method according to claim 1 wherein the electronic device is a MOSFET.

14. The method according to claim 1 wherein the semiconductor body is of Silicon Carbide of the polytype 4H.

15. A method, comprising:

forming a first source region in a first side of a semiconductor body, forming a metal layer coupled to the first source region and the first side of the semiconductor body;

forming a first ohmic contact in the first source region;

forming a first stack of protection layers on the first side of the semiconductor body on the ohmic contact;

forming a gate dielectric layer directly on the first side of the semiconductor body and on the first stack of protection layers;

forming a conductive layer on the gate dielectric layer;

forming a first opening through the gate dielectric layer, the conductive layer, and the first stack of protection layers, the first opening exposing the first ohmic contact;

forming a first insulating layer covering the gate dielectric layer and the conductive layer;

forming a metallization layer on the first insulating layer, the metallization layer being coupled to the first ohmic contact, the first insulating layer entirely separating the gate dielectric, the conductive layer, and the first stack of protection layers from the metallization layer; and forming a second insulating layer on the metallization layer, the second insulating layer having a first sidewall coplanar with the first sidewall of the first insulating layer and second sidewall coplanar with the second sidewall of the first insulating layer.

16. The method according to claim 15 wherein the forming the gate dielectric layer includes photolithography.

17. The method according to claim 15 wherein the forming a first ohmic contact includes a high-temperature thermal annealing process, wherein a reaction occurs between the metal layer and the semiconductor body.

18. A method, comprising:

forming a first body well in a first side of a semiconductor body, the first body well having a first side coplanar with the first side of the semiconductor body;

forming a first source region in the first body well, the first source region having a first side coplanar with the first side of the semiconductor body;

forming a first implanted region in the first source region, the first implanted region having a first side coplanar with the first side of the semiconductor body;

forming a deposition mask layer on the first side of the semiconductor body, the deposition mask layer having a first opening exposing the first source region;

forming a metal layer on the deposition mask layer, the metal layer being coupled to the first source region through the first opening in the deposition mask layer;

forming a first ohmic contact in the first source region;

forming a first protection layer on the first ohmic contact;

forming a second protection layer on the first protection layer;

forming a gate dielectric layer on the first side of the semiconductor body, the gate dielectric layer covering and being directly on the first side of the first source region;

forming a conductive layer on the gate dielectric layer;

exposing the first ohmic contact by forming a first opening entirely through the conductive layer, the gate dielectric layer, and the first and second protection layers;

forming an insulating layer on the first and second protection layers, the gate dielectric layer, and the conductive layer, the insulating layer being directly on the first side of the semiconductor body on the first source region; and forming a first metallization on the insulating layer, the first metallization extending in the first opening and being coupled to the first ohmic contact.

19. The method according to claim 18, comprising removing the metal layer and the deposition mask layer after the forming the first ohmic contact.

20. The method according to claim 18 wherein the first body well has a first doping type and a first doping concentration, and the first implanted region has the first doping type and a second doping concentration that is greater than the first doping concentration.

* * * * *